United States Patent

Lombardi et al.

[15] 3,681,474

[45] Aug. 1, 1972

[54] ELECTRICAL SUBSTRATES

[72] Inventors: Louis J. Lombardi, Roselle; Roy J. Coyne, Oak Lawn; Charles E. Green, Brookfield, all of Ill.

[73] Assignee: The Richardson Company, Cook County, Ill.

[22] Filed: Sept. 12, 1969

[21] Appl. No.: 857,571

[52] U.S. Cl. .............260/876 B, 29/195, 117/123 D, 117/138.8 A, 117/138.8 F, 161/198, 161/203, 161/205, 161/208, 161/248, 161/250, 174/68.5, 260/17.4 BB, 260/33.6 UA, 260/41.5 R, 260/876 R, 260/894

[51] Int. Cl. ..........................C08f 29/12, C08f 33/08

[58] Field of Search................260/894, 876 B, 876 R

[56] References Cited

UNITED STATES PATENTS 3,562,204 2/1971 van Breen.....................260/876
3,166,609 1/1965 Wilder..........................260/894
3,476,830 11/1969 Naarmann et al. ...........260/894

FOREIGN PATENTS OR APPLICATIONS 1,204,819 11/1965 Germany......................260/876

*Primary Examiner*—Samuel H. Blech
*Attorney*—John L. Hutchinson, William Lohff and Alan M. Abrams

[57] ABSTRACT

A circuit board with hydrocarbon substrate based on a polymer of a $C_4$ to $C_6$ conjugated diene with more than 50 percent of its unsaturation being 1, 2 is improved by the combination of a second hydrocarbon polymer with lower amounts of 1, 2 unsaturation and correspondingly higher amounts of 1, 4 unsaturation.

5 Claims, No Drawings

ELECTRICAL SUBSTRATES

BACKGROUND

This invention relates to the development of printed circuit boards and more particularly to circuit boards with a hydrocarbon substrate, an electrical circuit and good physical stability at elevated temperatures.

Printed circuit boards and similar forms of electrical circuits have become important in the electronics industry. In general, they comprise a metal coating in the form of a circuit on one or more surfaces of an electrically non-conductive substrate.

As described in copending application Ser. No. 812,900, hydrocarbon substrates have been developed which are useful in producing printed circuit boards with very good electrical properties. In one process of producing these boards, a hydrocarbon polymer is cured with a peroxy catalyst to form the substrate which is then treated with a chemical etch and subjected to electroless deposition of a metal such as copper or nickel to form a metal coating. This coating is then usually electroplated with a second metal coating in a predetermined pattern identified with the desired circuit.

Several properties are of importance in the resultant circuit board. In general, these are related to desirable bond strengths between the substrate and metal, ease of etchability of the substrate, physical stability of the board, and retention of electrical properties of the substrate in the resultant printed circuit board.

Among the hydrocarbons described in Ser. No. 812,900, not all provide all of these properties in the combination to the same degree. One particular polymer based on butadiene and characterized by an olefinic unsaturation in which more than 50 percent is 1, 2 in contrast to 1, 4 unsaturation, has been found to provide printed circuit boards with very good physical stability at ambient and elevated temperatures. This polymer when cured to form the substrate can also be chemically etched and coated with metal by electroless metal deposition. However, the usual etch times are in the order of 15 minutes whereas a time of 5 minutes or less is of much greater practical significance. In addition, the etch often results in some pitting in the substrate which causes a rough surface of metal in subsequent operations. Accordingly, it is desirable to develop a printed circuit board with an improved combination of properties.

SUMMARY

Briefly, the invention is directed to the production of a printed circuit board based on a hydrocarbon substrate and having an improved combination of bond strength, ease of etchability of the substrate, physical stability and retention of electrical properties.

The new substrate is based on a blend of the above defined butadiene polymer with high 1, 2 unsaturation and a second polymer with low 1, 2 unsaturation. Surprisingly, the blend when cured under conventional conditions provides a substrate which can be etched in less than 15 minutes and more often about 5 minutes or less. Also, the printed circuit board based on this blend exhibits good bond strengths between the metal and substrate, and has very good physical stability and retention of electrical properties.

DETAILED DESCRIPTION

As described above, the first hydrocarbon polymer has more than 50 percent of its olefinic unsaturation as 1, 2 with the remainder being essentially 1, 4. Advantageously, the 1, 2 unsaturation is about 50–90 percent and preferably about 60–90 percent with cis 1, 4 unsaturation being the predominate form of the remaining unsaturation.

These polymers are based on a $C_4$ to $C_6$ conjugated diene and include homopolymers and copolymers with a vinyl aromatic monomer such as styrene. Illustrative conjugated dienes are those with four to six carbon atoms such as butadiene, isoprene, piperylene, dimethyl butadiene, methyl pentadiene and the like, and preferably butadiene. Illustrative vinyl aromatic monomers are styrene, vinyl toluene, vinyl xylene, ethyl vinyl benzene, isopropyl styrene and the like and preferably styrene. Often, these products are liquid in their initial state. However, further reactions such as graft polymerization can be carried out with vinyl aromatics or the like to produce solid products. These polymers also include those with polar end groups such as hydroxy, carboxy and the like.

In general, the copolymers from the conjugated diene and a vinyl aromatic monomer are random or graft copolymers with at least 25 mole percent, advantageously, about 35–100 mole percent, and preferably about 50–100 mole percent of conjugated diene with the remainder based on the modifying monomer. They also typically have a molecular weight of at least 500 and advantageously about 500–500,000. Typical polymers within the above description are also described in U.S. Pat. Nos. 3,105,828 and 3,306,949 and copending Ser. No. 812,900.

The second polymer has less than 50 percent of its olefinic unsaturation as 1, 2 with the remainder being 1, 4 unsaturation. Although not known for certain, it is believed that the 1, 4 unsaturation in the blend contributes to the improved etchability of the substrate with resultant mirror-like surfaces of deposited metal whereas the 1, 2 unsaturated contributes to the ease of cure and physical stability of the substrate and printed circuit board.

As described above, the second hydrocarbon polymer is further defined as one being based on a conjugated diene with four to six carbon atoms such as butadiene, and has a 1, 2 unsaturation below about 50 percent of the total. In general, these hydrocarbon polymers include butadiene and similar conjugated diene homopolymers and copolymers with such modifiers as styrene and other ethylenically unsaturated monomers. Particular polymers of interest are further described in U.S. Pat. No. 3,265,765 (which reference is incorporated herein) as block copolymers of a non-elastomeric polymer block and an elastomeric polymer block and advantageously of a vinyl aromatic polymer block and a conjugated diene polymer block. Advantageously, the polymers are high molecular weight block copolymers with a general formula of A–B, A–B–A, A–B–A–B–A and the like wherein "A" is a non-elastomeric polymer having an average molecular weight of 2,000–100,000 and a glass transition temperature above about 25° C. The polymer block "B" is characterized as having an average molecular weight between about 25,000 and 1,000,000 and a glass transition temperature below about 10° C.

Normally, these block copolymers are linear and contain less than about 50 weight percent but at least 10 weight percent of the vinyl aromatic hydrocarbon polymer and more than 50 weight percent of the conjugated diene polymer.

The vinyl aromatic polymer block is derived from styrene, vinyl toluene, vinyl xylene, ethyl vinyl benzene, isopropyl-styrene and the like and preferably styrene. The conjugated diene polymer block is derived from butadiene, isoprene, piperylene, dimethyl butadiene, methyl pentadiene and the like and preferably butadiene. Illustrative of a preferred copolymer is one containing about 25 weight percent styrene and about 75 weight percent butadiene.

Resin mixtures of the above defined first and second polymers include the second polymer in an amount sufficient to improve the etchability of the cured product compared to a product from the first polymer. Generally, this amount can vary significantly and normally is the range of about 5–95, advantageously about 10–90 weight percent, and preferably 20–40 weight percent.

In the production of laminates or reinforced substrates, the resin mixture is often applied on a reinforcing member such as cellulosic materials, glass or inert fillers composed of glass, asbestos or the like. In some instances, the reinforcing members are pretreated to improve bonding with the resin mixture as illustrated by the pretreatment of paper with a phenol-formaldehyde resin. Hydrocarbon laminates composed of a reinforcing member such as phenol-formaldehyde treated paper or glass fibers and the resin mixture are a particularly useful substrate.

The substrate can also be formed from other core materials such as phenolics, epoxies, polyesters, ceramics and the like wherein one or more surfaces are coated at least partially with the defined resin mixture.

The resin mixture in the form of a substrate is usually in a cured form before being etched. Typical curing conditions include a free radical catalyst such as an organic peroxide and sufficient temperature to activate the catalyst. Usually, the peroxide is present in about ½–10 weight percent of the resin blend. Suitable peroxides are listed in Kirk-Othmer, Encyclopedia of Chemical Technology, Vol. 14, and particularly those with activation temperatures of 30°–50° C. and above. Other catalysts are sulfur-containing vulcanizers as used with synthetic or natural elastomers and free radicals generated by irradiation. Temperatures are usually in the order of 80°–100° C. and above to provide the desired cure. Also during curing other curing additives can be present such as styrene, divinyl toluene, and the like.

After formation of the cured substrate, the substrate surface is etched and sensitized. Advantageously, the etching is carried out with strong acids such as sulfuric or phosphoric with substances such as sodium dichromate. The severity of the etch is somewhat dependent on the extent of cure of the hydrocarbon surface. The sensitizing step is carried out with reducing agents such as stannous chloride followed by palladium chloride or other catalyst. It is understood that partial masking of the surface can be carried out before the etching or sensitizing step to limit the modification of the surface where only insulating and not circuit properties are required.

A metal coating is then applied to the sensitized surface by electroless deposition techniques. This usually results in a thin coating with a thickness in the order of 1 mil. and below and minimizes subsequent metal removal during the formation of circuit elements. The metal applied is conveniently nickel, copper, cobalt, gold or other metal selected both for ease of application and performance in the final circuit board. Usually, the metal is a transition metal with an atomic number of about 21–79 such as nickel, copper, gold, silver, cobalt, and the like. Preferably the metal is nickel or copper.

When the metal coating is applied over the entire hydrocarbon surface, this layer is often partially masked and the remaining areas electroplated to provide a final metal layer for circuit purposes. The metal selected is also one within the above group of transition metals and preferably is copper, silver, or gold. The mask and underlying electroless metal is then removed by known techniques.

The resultant board commonly exhibits bond strengths in excess of 1 lb./in. as measured by the 90° peel test and often exhibits values of 3–4 lbs./in. and above. Accordingly, the performance of the resultant board is considered very satisfactory for its purpose.

The following example illustrates some of the embodiments of this invention. It is to be understood that this is for illustrative purposes only and does not purport to be wholly definitive to conditions or scope.

EXAMPLE

A resin mixture was prepared which contained a graft copolymer of polybutadiene and styrene with about 40 mole percent of styrene and a block copolymer of butadiene and styrene with about 23–25 weight percent styrene. The first polymer had a 1, 2 unsaturation of about 60–70 percent while the second had a 1, 2 unsaturation of less than 50 percent. The mixture contained approximately 70 weight percent of the first polymer and 30 percent of the second.

A solution of the resin mixture in toluene was prepared which contained dicumyl peroxide (Di-Cup T) as the catalyst. This resinous solution was used to impregnate a phenol-formaldehyde treated paper and the saturated product was cured to a "B" stage at about 120° C. (245° F.) for 5 minutes.

Eight sheets of the treated stock were subjected to 1,500 psig. at about 165° C. (330 ° F.) to form a laminate of approximately one-sixteenth inch in thickness.

Samples of the laminate were etched for about 5 minutes at 55° C. with an aqueous solution of sodium dichromate, (2 wt. percent), 96 percent sulfuric acid (69 wt. percent) and 85 percent phosphoric acid (25 wt. percent). A nickel layer was subsequently deposited on the treated surface and a copper layer was electroplated over the nickel. The excess metal was removed to form a circuit and tests were performed on the samples. The samples withstood a dip solder test at about 260° C. (500 F.) for 9 seconds and had a 90° peel strength of 5 lbs./in. The samples also exhibited physical stability by resistance to cold flow at ambient temperatures and at about 40°–60° C. (100°–135° F.).

Electricals on the substrate were also determined to be as follows:

Dielectric constant (1MC) 3.7

Dissipation Factor 0.025

Insulation resistance $1 \times 10^6$ meg ohms

In comparison, samples of printed circuit boards based on the above graft copolymer alone have when cured, normally required an etch time of about 15 minutes at 80° C. to form a surface for metal coating.

We claim:

1. A resin particularly suitable as a substrate for electroless metal deposition in preparing printed circuit boards, comprising a blend of a first and second copolymer of butadiene-styrene where the first copolymer has a 1,2 unsaturation greater than 50 percent and the second copolymer a 1,2 unsaturation of less than 50 percent of the total unsaturation and where the second copolymer is present in the blend within the range of from about 5 to about 95 weight percent, said first copolymer being a graft copolymer of styrene on polybutadiene and containing at least about 50 mol percent butadiene and having a molecular weight of from 500 to 500,000 and said second copolymer being a block copolymer and containing at least about 50 weight percent butadiene.

2. The resin blend of claim 1 wherein the first copolymer has a 1,2 unsaturation of from 60 to 90 percent of the total unsaturation.

3. The resin blend of claim 1 wherein the second copolymer is present in the blend within the range of from about 10 to about 90 weight percent.

4. The resin blend of claim 3 wherein the second copolymer is present within the range of from about 20 to about 40 weight percent.

5. The resin blend of claim 1 wherein the blend contains a reinforcing element.

* * * * *